United States Patent [19]

Imai et al.

[11] Patent Number: 4,952,832
[45] Date of Patent: Aug. 28, 1990

[54] SURFACE ACOUSTIC WAVE DEVICE

[75] Inventors: Takahiro Imai; Hideaki Nakahata; Naoji Fujimori, all of Itami, Japan

[73] Assignee: Sumitomo Electric Industries, Ltd., Osaka, Japan

[21] Appl. No.: 425,956

[22] Filed: Oct. 24, 1989

[51] Int. Cl.$^5$ .............................................. H01L 41/08
[52] U.S. Cl. ............................ 310/313 A; 310/313 R
[58] Field of Search ..................... 310/313 A, 313 R; 333/150, 151, 154, 155, 193

[56] References Cited

U.S. PATENT DOCUMENTS

| | | | |
|---|---|---|---|
| 4,354,130 | 10/1982 | Ono et al. | 310/313 A |
| 4,511,816 | 4/1985 | Mikoshiba et al. | 310/313 A |
| 4,567,393 | 1/1986 | Asai et al. | 310/313 A |
| 4,571,519 | 2/1986 | Kawabata et al. | 310/313 A |
| 4,752,709 | 6/1988 | Fujishima et al. | 310/313 A |

FOREIGN PATENT DOCUMENTS

| | | | |
|---|---|---|---|
| 0197912 | 11/1983 | Japan | 310/313 A |
| 0124112 | 7/1985 | Japan | 310/313 A |

Primary Examiner—Mark O. Budd
Attorney, Agent, or Firm—Cushman, Darby & Cushman

[57] ABSTRACT

A surface acoustic wave device which comprises a piezoelectric layer, a carbonaceous layer which is selected from the group consisting of a diamond layer and a diamond-like carbon layer and formed on at least one surface of the piezoelectric layer, and at least a pair of interdigital transducer electrodes, can be used in an extremely high frequency region.

12 Claims, 4 Drawing Sheets

SURFACE ACOUSTIC WAVE DEVICE

BACKGROUND OF THE INVENTION

1. Field of the Invention

The present invention relates to a surface acoustic wave device. More particularly, it relates to a surface acoustic wave device which are used as a high frequency filter and the like.

2. Description of the Related Arts

A surface acoustic wave device is a solid state high frequency device which utilizes the resonance phenomenon of surface acoustic wave propagating on the solid surface. The surface acoustic wave device is compact and thermally stable and has long life and good phase characteristic. In addition, it interacts with electron or light relatively easily. Therefore, a surface acoustic wave filter, which is an example of the surface acoustic wave device, is used as a medium frequency filter of a television set, etc.

Conventionally, the surface acoustic wave device is produced by forming interdigital electrodes on piezoelectric single crystal such as $LiNbO_3$ and $LiTaO_3$. Recently, it is produced by forming the piezoelectric layer such as ZnO on a substrate such as glass by a spattering method, etc.

However, the piezoelectric layer such as ZnO formed on the glass is not suitable for use in a high frequency band more than 100 MHz since it is a polycrystal substance which usually has orientation and many losses due to scattering. Therefore, the piezoelectric single crystal layer such as ZnO is grown on a sapphire.

In the surface acoustic wave device, a useful frequency is determined by a phase velocity of the acoustic wave propagating on the solid surface and an distance between interdigitial electrodes. Shorter the distance between electrodes is, or larger the phase velocity is, then at higher frequency the device is used. In order to achieve the high frequency, attempts are made to grow a piezoelectric C-axis orientated layer such as ZnO on alumina polycrystal which is cheaper than sapphire and achieves a higher sound speed than glass, but the satisfactory result is not obtained. Conventionally, the distance between electrodes is at least 1.2 μm because of fine processing technique, and the fine processing technique is complex and a yield is not good.

When the electrodes are formed with a distance of 1.2 μm, 2 GHz is the upper limit of the high frequency even if the piezoelectric layer is formed on the substrate, such as sapphire, which enables relatively high sound speed. The surface acoustic wave device which has extremely high frequency is required.

SUMMARY OF THE INVENTION

An object of the present invention is to provide a surface acoustic wave device which can be used in a extremely high frequency band.

This and other objects are achieved by a surface acoustic wave device which comprises a piezoelectric layer, a carbonaceous layer which is selected from the group consisting of a diamond layer and a diamond-like carbon layer and formed on at least one surface of the piezoelectric layer, and at least a pair of interdigital transducer electrodes.

DETAILED DESCRIPTION OF THE INVENTION

Figure 1:
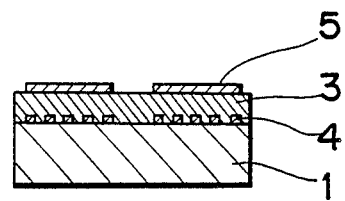
FIG. 1 shows a sectional view of one example of a surface acoustic wave device of the prior art.

The carbonaceous layer is the diamond layer or the diamond-like carbon layer.

The diamond layer may form a part or whole of the substrate. The diamond is suitable as the substrate, since it enables the highest sound speed and is thermally and chemically stable.

The diamond layer may be electrically insulative as a whole or at least partially semiconductive.

The diamond layer usually has a thickness of 0.5 to 10 μm.

The diamond-like carbon is non-crystalline carbon containing a slight amount of hydrogen, has the similar bonding system as the diamond, and is an insulating material. Its hardness equals to about half of that of diamond, and its density is 1.6 to 1.9 $g/cm^3$ which equals to about half of that of diamond. Therefore the diamond-like carbon enable the sound speed which equals to the sound speed in diamond. The diamond which is one of the materials achieving the highest sound speed among all materials. The sound speeds in various materials are indicated in Table 1.

TABLE 1

| Material | Sound Speed (m/sec.) |
|---|---|
| Diamond | 18,000 |
| Sapphire | 12,000 |
| Soda glass | 1,600 |
| ZnO | 3,500 |
| $LiNbO_3$ | 3,600 |
| $LiTaO_3$ | 3,000 |
| $Pb(Zr,Ti)O_3$ | 1,500–2,000 |

The diamond-like carbon layer usually has a thickness of 0.5 to 10 μm.

The piezoelectric layer preferably comprises an inorganic material, for example, ZnO, AlN, $Pb(Zr,Ti)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe, CdS and the like. The thickness of the piezoelectric layer is usually 0.3 to 3 μm.

The surface acoustic wave device have the electrodes in addition to the carbonaceous layer and the piezoelectric layer. The electrodes are usually made of metal, but may be of a semiconductive diamond. This is preferable in comparison with as single crystal sapphire and the like which cannot be electrically conductive. The surface acoustic wave device according to the present invention may have both of the semiconductive diamond layer and the metal electrode.

The electrodes are usually a pair of interdigital electrodes. An electrode for surface short circuit may be additionally used.

The diamond layer and the piezoelectric layer may be of single crystal or polycrystal. When the surface acoustic wave device is used in extremely high frequency region, single crystal which has low acoustic scattering is preferable.

The single crystal natural diamond has diverse quality and is expensive. Nowadays, the single crystal diamond with uniform quality is artificially produced under very high pressure and easily available.

The polycrystal diamond can be produced in the vapor phase from a gas such as hydrocarbon. Vapor phase deposition of the polycrystal diamond can be carried out by (1) activating the raw material gas by heating an electron radiation material, (2) exciting the gas with plasma, (3) decomposing and exciting the gas with light and (4) growing the polycrystal diamond through ion bombardment. Any of these methods can give the suitable polycrystal diamond.

The single crystal diamond layer grown on the single crystal substrate other than the diamond can be used.

The single crystal layer of the inorganic piezoelectric material such as ZnO, AlN, $Pb(Zr,Ti)O_3$ can be grown on the single crystal diamond by the vapor phase deposition method such as a spattering method or a CVD method.

The polycrystal layer of the piezoelectric material which has crystal orientation necessary for the surface acoustic wave device can grow on the polycrystal diamond by the same method.

The piezoelectric polycrystal layer can be formed on the single crystal diamond layer by selecting a growing method and a growth speed of the piezoelectric layer.

Highly pure diamond is an insulating material with a low dielectric constant. By introducing an impurity such as B, Al, P, S, and/or lattice defects through corpuscular radiation such as ion injection or electron beam radiation, the semiconductive diamond layer can be formed. The single crystal diamond containing boron is rarely mined or can be artificially synthesized by the very high pressure method.

The semiconductive single crystal diamond layer can be easily formed on the insulative highly pure single crystal diamond by the vapor phase deposition method and can be processed to form the interdigital electrodes. In the same manner, the semiconductive polycrystal diamond can be formed by the vapor phase growth method to make the interdigital electrodes.

The diamond layer can be laminated on the bulk piezoelectric material, but the piezoelectric material thin layer is preferably formed on the diamond layer.

The substrate may be any material, such as glass, Si and metal which is used as the substrate of surface acoustic wave device.

The electrodes can be formed in any position in relation to the substrate, the diamond-like carbon and the piezoelectric layer. Since an electromechanical coupling factor is large and the electrode is not exposed to an ambient environment and not damaged, the configuration of piezoelectric layer/interdigital electrodes/diamond-like carbon layer/substrate is particularly preferable. The configuration of interdigital electrodes/piezoelectric layer/diamond-like carbon layer/substrate is also preferable.

The diamond-like carbon layer can be synthesized in the gas phase from a gas such as hydrocarbon on the various substrates such as glass, Si and metal. Vapor phase deposition of the diamond-like carbon can be carried out by (1) activating the raw material gas by heating an electron radiation material, (2) exciting the gas with plasma, (3) decomposing and exciting the gas with light and (4) growing the carbon through the ion bombardment. Any of these methods can give suitable diamond-like carbon.

The diamond-like carbon layer which is homogenous and has large area can be prepared and the cost is lower than sapphire.

Generally, when the surface acoustic wave device having laminate structure is formed, the piezoelectric layer has poor crystallinity, the large electromechanical coupling factor cannot be achieved and surface smoothness of the piezoelectric layer is deteriorated if a primary layer on which the piezoelectric layer is formed has poor smoothness. Therefore, propagation loss of the surface wave increases, and breaking or short circuit of the interdigital electrode occurs. However, when the diamond-like carbon layer is used, its surface is very smooth. Then, the above defects do not occur and surface polishing after formation of the diamond-like carbon layer is not necessary.

The polycrystal layer of inorganic piezoelectric material such as ZnO, AlN and $Pb(Zr,Ti)O_3$ can be formed on the diamond-like carbon layer by gas phase synthesis such as spattering or the CVD method. The resulting piezoelectric layer has a smooth surface and enough crystal orientation to give a large electromechanical coupling factor. Even if the electrode is formed on the diamond-like carbon layer, the piezoelectric layer can be easily formed.

FIGS. 2A to 2D show sectional views of various embodiments of the surface acoustic wave device having a diamond layer according to the present invention.

Figure 2A:
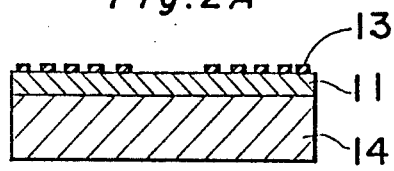
FIGS. 2A to 2D show sectional views of examples of the surface acoustic wave device having a diamond layer according to the present invention.

In FIG. 2A, a surface acoustic wave device has a piezoelectric layer 11 formed on an insulating diamond layer 14, and interdigital electrodes 13 formed on the piezoelectric layer 11.

Figure 2B:
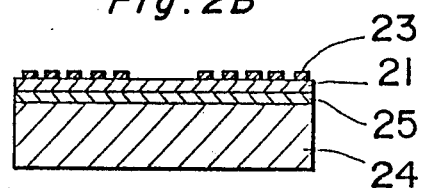

In FIG. 2B, a surface acoustic wave device has a semiconductive diamond layer 25 formed on an insulating diamond layer 24, a piezoelectric layer 21 formed on the semiconductive diamond layer 25 and electrodes 23 formed on the piezoelectric layer 21.

Figure 2C:
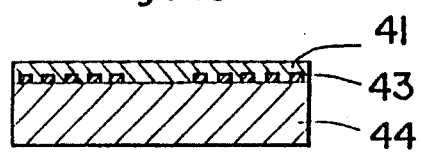

In FIG. 2C, a surface acoustic wave device has a metal electrodes 43 between an insulating diamond layer 44 and a piezoelectric layer 41.

Figure 2D:
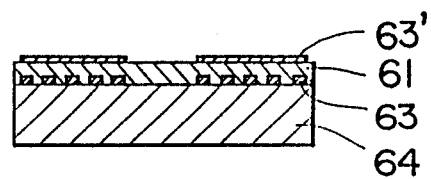

In FIG. 2D, this surface acoustic wave device is the same as that of FIG. 2C except that an electrodes 63' are formed on the piezoelectric layer 61. The electrodes 63' are the interdigital electrodes which extend at the angle of 90° with the interdigital metal electrodes 63.

In the surface acoustic wave devices shown in FIGS. 2A to 2D, the piezoelectrical layer, the insulating diamond layer and the semiconductive layer may be single crystal or polycrystal.

Figure 3:
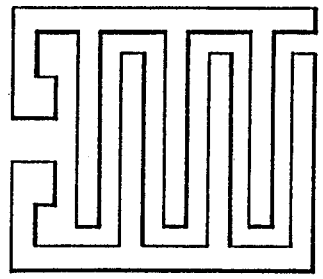
FIG. 3 shows a plane view of one example of the pattern of electrodes.
Figure 3:
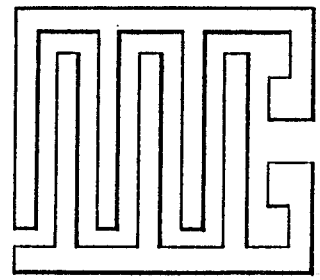

FIG. 3 shows a plane view of one example of a pattern of the electrodes. The electrodes are preferably interdigital.

FIGS. 4A to 4H show sectional views of various embodiments of the surface acoustic wave devices having a diamond-like carbon layer according to the present invention. Each of these surface acoustic wave devices has a substrate 71, a diamond layer or a diamond-like carbon layer 72, a piezoelectric layer 73, interdigital electrodes 74 and, optionally, a surface (or boundary) short circuit electrode 75. The device in which the interdigital electrodes 74 are formed in a boundary between the substrate 71 and the diamond layer or diamond-like carbon layer 72 is not good, since the piezoelectric layer 73 cannot be activated directly by the interdigital electrodes 74 so that the electromechanical coupling factor is decreased.

FIGS. 5A to 5D show sectional views of the examples of the surface acoustic wave device having a diamond layer or a diamond-like carbon layer according to the present invention. Each of these surface acoustic devices has a substrate 81, a diamond layer or a diamond-like carbon layer 82, a piezoelectric layer 83 and interdigital electrodes 84. The substrate may be single crystal diamond 85.

FIG. 1 shows a sectional view of a surface acoustic wave device of the prior art. This device is the same as that of FIG. 4A except that this device has no diamond-like carbon layer. The device has a substrate 1, a piezoelectric layer 3, electrodes 4 and 5.

The present invention provides the surface acoustic wave device which can be used in the very high frequency region. The device is compact and easily mass-produced.

The surface acoustic wave device of the present invention may be used as a filter, a resonator, a delay line or a signal processing device and a convolver.

Now, the present invention is explained by following examples.

EXAMPLES 1 TO 5 AND COMPARATIVE EXAMPLES 1 TO 4

On various substrates each having a size of 3 mm × 2 mm × 0.3 mm, a ZnO piezoelectric layer and metal electrodes were formed and a resonance frequency was measured. The ZnO layer was formed by spattering ZnO polycrystal with a mixture gas of Ar and oxygen. The single crystal diamond as a substrate had the polished (100) plane of artificial Ib-type diamond produced under very high pressure. A polycrystal diamond layer was formed by using a feed gas comprising $CH_4$ diluted with 100 times volume of $H_2$ by the microwave plasma CVD method to make the polycrystal diamond layer having a thickness of 50 micrometers on the Si plate.

The results are shown in Table 2.

TABLE 2

| Example No. | Piezoelectrical layer ($\mu m$) | | Substrate | Distance between electrodes ($\mu m$) | Resonance frequency (GHz) |
|---|---|---|---|---|---|
| 1 | Polycrystal ZnO | (2.0) | Polycrystal diamond | 2.0 | 0.672 |
| 2 | ↑ | (2.0) | ↑ | 1.4 | 0.966 |
| 3 | Single crystal ZnO | (1.0) | Single crystal diamond | 2.0 | 0.853 |
| 4 | ↑ | (1.0) | ↑ | 1.4 | 1.214 |
| 5 | ↑ | (0.7) | ↑ | 1.4 | 1.304 |
| Comp. | | | | | |
| 1 | Polycrystal ZnO | (2.0) | Soda glass | 2.0 | 0.273 |
| 2 | ↑ | (2.0) | Polycrystal $Al_2O_3$ | 2.0 | 0.438 |
| 3 | Single crystal ZnO | (1.0) | Sapphire | 2.0 | 0.610 |
| 4 | ↑ | (1.0) | ↑ | 1.4 | 0.857 |

From the results of Table 2, it is understand that the resonance frequency is high in case of the diamond substrate when the piezoelectrical layer thickness and the distance between electrodes are the same.

EXAMPLE 6 AND COMPARATIVE EXAMPLE 5

Figure 4A:
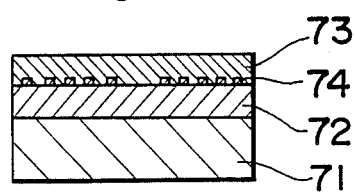
FIGS. 4A to 4H show sectional views of the examples of the surface acoustic wave device having a diamond layer or a diamond-like carbon layer according to the present invention.
Figure 4B:
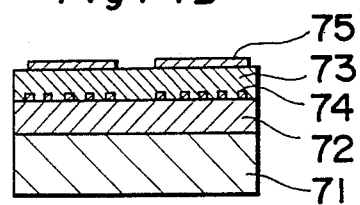
Figure 4C:
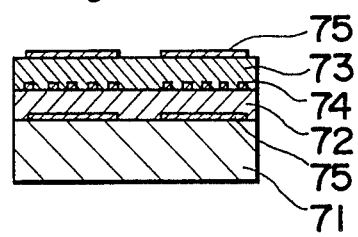
Figure 4D:
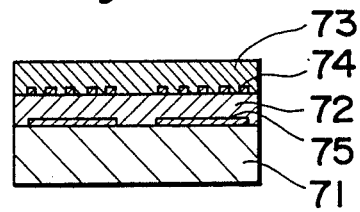
Figure 4E:
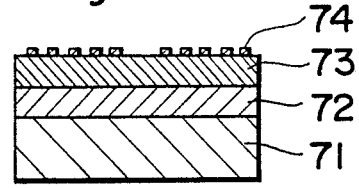
Figure 4F:
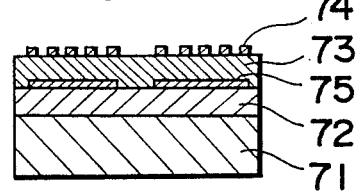
Figure 4G:
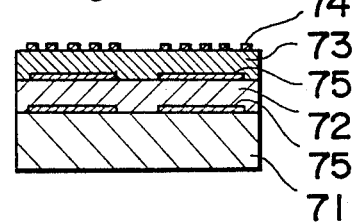
Figure 4H:
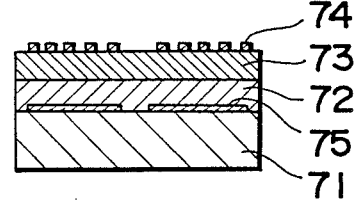
Figure 5A:
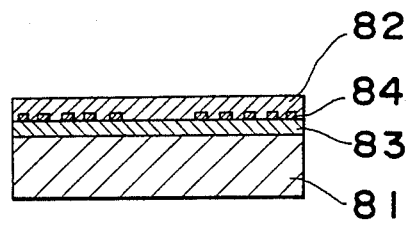
FIGS. 5A to 5D show sectional views of the examples of the surface acoustic wave device having a diamond layer or a diamond-like carbon layer according to the present invention.
Figure 5B:
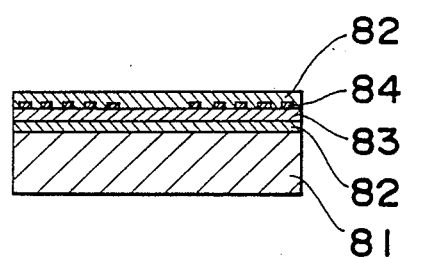
Figure 5C:
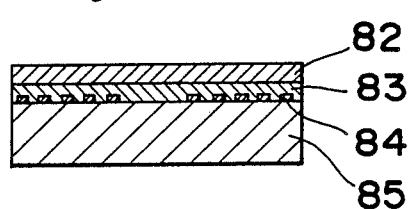
Figure 5D:
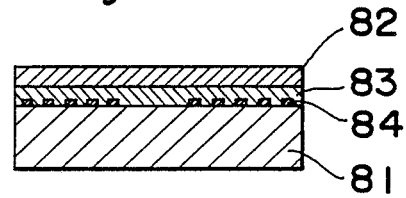

The diamond-like carbon layer, a a ZnO C-axis orientated piezoelectric layer and aluminum electrodes were laminated on a glass substrate (10 mm × 10 mm × 0.5 mm) to prepare a surface acoustic wave filter shown in FIG. 4B (Example 6). A surface acoustic wave filter as shown in FIG. 1 was prepared in the same manner as in the above but the diamond-like carbon layer was not formed and sapphire or alumina polycrystal was used as the substrate (Comparative Example 5).

The ZnO layer was formed in ten different thicknesses between 0.5 and 18 $\mu m$ by spattering ZnO polycrystal with a mixture gas of Ar and $O_2$. The diamond-like carbon layer was formed on the glass substrate by the plasma CVD method using $CH_4$ as a feed gas to a thickness of 15 $\mu m$. A distance between the interdigital electrodes was 2 $\mu m$ and an electrode cycle distance was 8 $\mu m$.

In the filter having the configuration of ZnO piezoelectric layer/diamond-like carbon layer/glass substrate according to the present invention, when the thickness of ZnO layer was 0.7 $\mu m$, the high frequency filter having the insertion loss of 15 dB and the center frequency of 1.27 GHz for the primary mode fundamental wave was obtained.

In contrast, in the filter having the configuration of ZnO piezoelectric layer/sapphire substrate or ZnO piezoelectric layer/alumina substrate, when the ZnO piezoelectric layer had the thickness of 1.8 $\mu m$, the highest resonance frequency (primary mode fundamental wave) of 610 MHz and the insertion loss of 16 dB were obtained, and when the ZnO piezoelectric layer had the thickness of 3.1 $\mu m$, the highest resonance frequency of 290 MHz and the insertion loss of 15 dB were obtained. When the sapphire substrate or the alumina substrate was used and the ZnO layer had a smaller thickness than the above, the filtering property was not observed.

What is claimed is:

1. A surface acoustic wave device which comprises a piezoelectric layer, a carbonaceous layer which is selected from the group consisting of a diamond layer and a diamond-like carbon layer and formed on at least one surface of the piezoelectric layer, and at least a pair of interdigital transducer electrodes.

2. The surface acoustic wave device according to claim 1, which further comprises a substrate under the carbonaceous layer.

3. The surface acoustic wave device according to claim 1, wherein the diamond layer is made of diamond single crystal.

4. The surface acoustic wave device according to claim 1, wherein the diamond layer is produced by vapor phase deposition.

5. The surface acoustic wave device according to claim 1, wherein the whole diamond layer is made of electrically insulating diamond.

6. The surface acoustic wave device according to claim 1, wherein at least a part of the diamond layer is made of semiconductive diamond which contains at least one impurity element selected from the group consisting of B, P, Al and S and/or lattice defects by corpuscular radiation.

7. The surface acoustic wave device according to claim 1, wherein the piezoelectric layer comprises at least one compound selected from the group consisting of ZnO, AlN, $Pb(Zr,Ti)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe and CdS.

8. The surface acoustic wave device according to claim 1, wherein the piezoelectric layer is made of single crystal.

9. The surface acoustic wave device according to claim 1, wherein the electrodes are interdigital electrodes, and the device has the configuration of piezoelectric layer/interdigital electrodes/diamond layer or diamond-like carbon layer/substrate.

10. The surface acoustic wave device according to claim 9, which has an electrode for short circuit between the substrate and the diamond layer or diamond-like carbon layer and/or on a surface of the piezoelectric layer.

11. The surface acoustic wave device according to claim 1, wherein the electrodes are interdigital electrodes, and the device has the configuration of interdigital electrodes/piezoelectric layer/diamond layer or diamond-like carbon layer/substrate.

12. The surface acoustic wave device according to claim 11, which has an electrode for short circuit between the substrate and the diamond layer or diamond-like carbon layer and/or between the diamond layer or diamond-like carbon layer and the piezoelectric layer.

* * * * *